(12) United States Patent
Mittelsteadt et al.

(10) Patent No.: US 7,627,805 B2
(45) Date of Patent: Dec. 1, 2009

(54) DATA CODING WITH AN EFFICIENT LDPC ENCODER

(76) Inventors: Cimarron Mittelsteadt, 28259 Maitland La., Saugus, CA (US) 91350; Wen-Yen Weng, 1719 Federal Ave. #12A, Los Angeles, CA (US) 90025

( * ) Notice: Subject to any disclaimer, the term of this patent is extended or adjusted under 35 U.S.C. 154(b) by 648 days.

(21) Appl. No.: 11/448,603

(22) Filed: Jun. 6, 2006

(65) Prior Publication Data

US 2007/0038916 A1 Feb. 15, 2007

Related U.S. Application Data

(60) Provisional application No. 60/688,820, filed on Jun. 8, 2005.

(51) Int. Cl.
*G06F 11/00* (2006.01)
(52) U.S. Cl. ...................................... 714/800
(58) Field of Classification Search ................. 714/799, 714/800
See application file for complete search history.

(56) References Cited

U.S. PATENT DOCUMENTS

| 6,785,863 | B2 * | 8/2004 | Blankenship et al. | 714/799 |
| 7,139,959 | B2 * | 11/2006 | Hocevar | 714/752 |
| 7,162,684 | B2 * | 1/2007 | Hocevar | 714/800 |

OTHER PUBLICATIONS

Richardson et al., Efficient encoding of low density parity check codes, Feb. 2001, IEEE Trans. on Info. theory, vol. 47, No. 2, p. 638-656.*
Cambridge University Press 2003, *Part VI Sparse Graph Codes*, pp. 556-573.
John R. Barry, *Low-Density Parity-Check Codes*, Georgia Institute of Technology, Oct. 5, 2001, pp. 1-20.

* cited by examiner

*Primary Examiner*—Shelly A Chase
(74) *Attorney, Agent, or Firm*—McDonnell Boehnen Hulbert & Berghoff LLP

(57) ABSTRACT

A method of coding data for transmission in a communication medium or channel. A codeword is generated from a mother code parity check matrix and a macro matrix. The mother code parity check matrix includes sub-matrices that are m-by-m square matrices with cyclic structure, and the macro matrix includes elements that represent nonzero sub-matrices of the mother code parity check matrix.

18 Claims, 8 Drawing Sheets

Mother Code Matrix

| Row | Column | Shift | Row | Column | Shift | Row | Column | Shift |
|---|---|---|---|---|---|---|---|---|
| 6 | 1 | 3 | 1 | 4 | 3 | 5 | 7 | 26 |
| 8 | 1 | 15 | 5 | 4 | 2 | 7 | 7 | 13 |
| 12 | 1 | 22 | 15 | 4 | 18 | 20 | 7 | 10 |
| 16 | 1 | 8 | 21 | 4 | 19 | 22 | 7 | 10 |
| 22 | 1 | 13 | 26 | 4 | 15 | 26 | 7 | 8 |
| 23 | 1 | 5 | 28 | 4 | 10 | 28 | 7 | 10 |
| 25 | 1 | 23 | 32 | 4 | 24 | 30 | 7 | 23 |
| 31 | 1 | 14 | 35 | 4 | 12 | 33 | 7 | 5 |
| 33 | 1 | 23 | 36 | 4 | 21 | 35 | 7 | 25 |
| 2 | 2 | 24 | 16 | 5 | 23 | 1 | 8 | 19 |
| 7 | 2 | 7 | 17 | 5 | 2 | 6 | 8 | 0 |
| 11 | 2 | 14 | 18 | 5 | 17 | 9 | 8 | 14 |
| 13 | 2 | 24 | 21 | 5 | 10 | 12 | 8 | 26 |
| 17 | 2 | 0 | 23 | 5 | 26 | 14 | 8 | 10 |
| 24 | 2 | 12 | 24 | 5 | 6 | 15 | 8 | 16 |
| 27 | 2 | 0 | 25 | 5 | 8 | 29 | 8 | 9 |
| 30 | 2 | 6 | 27 | 5 | 9 | 31 | 8 | 5 |
| 34 | 2 | 18 | 32 | 5 | 10 | 34 | 8 | 16 |
| 3 | 3 | 4 | 2 | 6 | 5 | 2 | 9 | 7 |
| 4 | 3 | 22 | 3 | 6 | 16 | 5 | 9 | 8 |
| 9 | 3 | 23 | 4 | 6 | 23 | 11 | 9 | 3 |
| 10 | 3 | 10 | 8 | 6 | 26 | 15 | 9 | 3 |
| 14 | 3 | 24 | 10 | 6 | 15 | 24 | 9 | 0 |
| 18 | 3 | 9 | 11 | 6 | 8 | 25 | 9 | 14 |
| 19 | 3 | 10 | 13 | 6 | 3 | 30 | 9 | 3 |
| 20 | 3 | 2 | 19 | 6 | 21 | 31 | 9 | 21 |
| 29 | 3 | 13 | 36 | 6 | 17 | 32 | 9 | 7 |

Figure 3A

Degree Distribution and Column Grouping (A)

| Column Group | #1 | | #2 | | #3 | #4 | #5 | #6 | | #7 | | | #8 |
|---|---|---|---|---|---|---|---|---|---|---|---|---|---|
| Column Degrees | 7 | 8 | 7 | 8 | 3 | 3 | 3 | 2 | 3 | 2 | 3 | 7 | 2 |
| No. of Columns | 4 | 1 | 4 | 1 | 12 | 12 | 12 | 6 | 8 | 5 | 4 | 2 | 1 (staircase) |

Figure 3B

Degree Distribution and Column Grouping (B)

| Column Group | #1 | #2 | #3 | #4 | #5 | #6 | #7 | | #8 | | | #9 |
|---|---|---|---|---|---|---|---|---|---|---|---|---|
| Column Degrees | 9 | 9 | 9 | 3 | 3 | 3 | 2 | 3 | 2 | 3 | 4 | 9 | 2 |
| No. of Columns | 4 | 4 | 4 | 12 | 12 | 12 | 6 | 8 | 4 | 2 | 1 | 2 | 1 (staircase) |

Figure 4A

Interleaver for Degree Distribution (A)

| i | 1 | 2 | 3 | 4 | 5 | 6 | 7 | 8 | 9 | 10 | | |
|---|---|---|---|---|---|---|---|---|---|---|---|---|
| $\pi(i)$ | 1 | 2 | 3 | 4 | 5 | 6 | 7 | 8 | 9 | 10 | | |

| i | 11 | 12 | 13 | 14 | 15 | 16 | 17 | 18 | 19 | 20 | 21 | 22 |
|---|---|---|---|---|---|---|---|---|---|---|---|---|
| $\pi(i)$ | 37 | 40 | 43 | 46 | 49 | 52 | 55 | 58 | 11 | 12 | 13 | 14 |

| i | 23 | 24 | 25 | 26 | 27 | 28 | 29 | 30 | 31 | 32 | 33 | 34 |
|---|---|---|---|---|---|---|---|---|---|---|---|---|
| $\pi(i)$ | 38 | 41 | 44 | 47 | 50 | 53 | 56 | 59 | 15 | 16 | 17 | 18 |

| i | 35 | 36 | 37 | 38 | 39 | 40 | 41 | 42 | 43 | 44 | 45 | 46 |
|---|---|---|---|---|---|---|---|---|---|---|---|---|
| $\pi(i)$ | 39 | 42 | 45 | 48 | 51 | 54 | 57 | 60 | 19 | 20 | 21 | 22 |

| i | 47 | 48 | 49 | 50 | 51 | 52 | 53 | 54 | 55 | 56 | 57 | 58 | 59 | 60 |
|---|---|---|---|---|---|---|---|---|---|---|---|---|---|---|
| $\pi(i)$ | 61 | 63 | 65 | 67 | 69 | 71 | 23 | 24 | 25 | 26 | 27 | 28 | 29 | 30 |

| i | 61 | 62 | 63 | 64 | 65 | 66 | 67 | 68 | 69 | 70 | 71 | 72 |
|---|---|---|---|---|---|---|---|---|---|---|---|---|
| $\pi(i)$ | 62 | 64 | 66 | 68 | 70 | 31 | 32 | 33 | 34 | 35 | 36 | 72 |

Figure 4B

Interleaver for Degree Distribution (B)

| i | 1 | 2 | 3 | 4 | 5 | 6 | 7 | 8 | 9 | 10 | 11 | 12 |
|---|---|---|---|---|---|---|---|---|---|----|----|----|
| π(i) | 1 | 2 | 3 | 4 | 5 | 6 | 7 | 8 | 9 | 10 | 11 | 12 |

| i | 13 | 14 | 15 | 16 | 17 | 18 | 19 | 20 | 21 | 22 | 23 | 24 |
|---|----|----|----|----|----|----|----|----|----|----|----|----|
| π(i) | 37 | 40 | 43 | 46 | 49 | 52 | 55 | 58 | 13 | 14 | 15 | 16 |

| i | 25 | 26 | 27 | 28 | 29 | 30 | 31 | 32 | 33 | 34 | 35 | 36 |
|---|----|----|----|----|----|----|----|----|----|----|----|----|
| π(i) | 38 | 41 | 44 | 47 | 50 | 53 | 56 | 59 | 62 | 17 | 18 | 19 |

| i | 37 | 38 | 39 | 40 | 41 | 42 | 43 | 44 | 45 | 46 | 47 | 48 |
|---|----|----|----|----|----|----|----|----|----|----|----|----|
| π(i) | 39 | 42 | 45 | 48 | 51 | 54 | 57 | 60 | 20 | 21 | 22 | 23 |

| i | 49 | 50 | 51 | 52 | 53 | 54 | 55 | 56 | 57 | 58 | 59 | 60 | 61 | 62 |
|---|----|----|----|----|----|----|----|----|----|----|----|----|----|----|
| π(i) | 61 | 63 | 65 | 67 | 69 | 71 | 24 | 25 | 26 | 27 | 28 | 29 | 30 | 31 |

| i | 63 | 64 | 65 | 66 | 67 | 68 | 69 | 70 | 71 | 72 |
|---|----|----|----|----|----|----|----|----|----|----|
| π(i) | 64 | 66 | 68 | 70 | 32 | 33 | 34 | 35 | 36 | 72 |

Figure 5A

Mother Code Matrix

| Row | Column | Shift |
|---|---|---|
| 6 | 1 | 3 |
| 8 | 1 | 15 |
| 12 | 1 | 22 |
| 16 | 1 | 8 |
| 22 | 1 | 13 |
| 23 | 1 | 5 |
| 25 | 1 | 23 |
| 31 | 1 | 14 |
| 33 | 1 | 23 |
| 2 | 2 | 24 |
| 7 | 2 | 7 |
| 11 | 2 | 14 |
| 13 | 2 | 24 |
| 17 | 2 | 0 |
| 24 | 2 | 12 |
| 27 | 2 | 0 |
| 30 | 2 | 6 |
| 34 | 2 | 18 |
| 3 | 3 | 4 |
| 4 | 3 | 22 |
| 9 | 3 | 23 |
| 10 | 3 | 10 |
| 14 | 3 | 24 |
| 18 | 3 | 9 |
| 19 | 3 | 10 |
| 20 | 3 | 2 |
| 29 | 3 | 13 |

| Row | Column | Shift |
|---|---|---|
| 1 | 4 | 3 |
| 5 | 4 | 2 |
| 15 | 4 | 18 |
| 21 | 4 | 19 |
| 26 | 4 | 15 |
| 28 | 4 | 10 |
| 32 | 4 | 24 |
| 35 | 4 | 12 |
| 36 | 4 | 21 |
| 16 | 5 | 23 |
| 17 | 5 | 2 |
| 18 | 5 | 17 |
| 21 | 5 | 10 |
| 23 | 5 | 26 |
| 24 | 5 | 6 |
| 25 | 5 | 8 |
| 27 | 5 | 9 |
| 32 | 5 | 10 |
| 2 | 6 | 5 |
| 3 | 6 | 16 |
| 4 | 6 | 23 |
| 8 | 6 | 26 |
| 10 | 6 | 15 |
| 11 | 6 | 8 |
| 13 | 6 | 3 |
| 19 | 6 | 21 |
| 36 | 6 | 17 |

| Row | Column | Shift |
|---|---|---|
| 5 | 7 | 26 |
| 7 | 7 | 13 |
| 20 | 7 | 10 |
| 22 | 7 | 10 |
| 26 | 7 | 8 |
| 28 | 7 | 10 |
| 30 | 7 | 23 |
| 33 | 7 | 5 |
| 35 | 7 | 25 |
| 1 | 8 | 19 |
| 6 | 8 | 0 |
| 9 | 8 | 14 |
| 12 | 8 | 26 |
| 14 | 8 | 10 |
| 15 | 8 | 16 |
| 29 | 8 | 9 |
| 31 | 8 | 5 |
| 34 | 8 | 16 |
| 2 | 9 | 7 |
| 5 | 9 | 8 |
| 11 | 9 | 3 |
| 15 | 9 | 3 |
| 24 | 9 | 0 |
| 25 | 9 | 14 |
| 30 | 9 | 3 |
| 31 | 9 | 21 |
| 32 | 9 | 7 |

Figure 5B

Mother Code Matrix

| Row | Column | Shift |
|---|---|---|
| 3 | 10 | 5 |
| 6 | 10 | 0 |
| 7 | 10 | 6 |
| 14 | 10 | 12 |
| 17 | 10 | 14 |
| 20 | 10 | 7 |
| 28 | 10 | 5 |
| 33 | 10 | 6 |
| 34 | 10 | 25 |
| 8 | 11 | 21 |
| 9 | 11 | 6 |
| 13 | 11 | 19 |
| 16 | 11 | 17 |
| 19 | 11 | 4 |
| 22 | 11 | 25 |
| 29 | 11 | 26 |
| 35 | 11 | 18 |
| 36 | 11 | 1 |
| 1 | 12 | 7 |
| 4 | 12 | 9 |
| 10 | 12 | 25 |
| 12 | 12 | 2 |
| 18 | 12 | 0 |
| 21 | 12 | 5 |
| 23 | 12 | 3 |
| 26 | 12 | 2 |
| 27 | 12 | 21 |

| Row | Column | Shift |
|---|---|---|
| 6 | 13 | 9 |
| 31 | 13 | 18 |
| 36 | 13 | 16 |
| 3 | 14 | 24 |
| 9 | 14 | 16 |
| 26 | 14 | 12 |
| 21 | 15 | 26 |
| 24 | 15 | 9 |
| 35 | 15 | 18 |
| 18 | 16 | 3 |
| 29 | 16 | 13 |
| 34 | 16 | 15 |
| 4 | 17 | 20 |
| 25 | 17 | 6 |
| 31 | 17 | 8 |
| 13 | 18 | 12 |
| 16 | 18 | 3 |
| 36 | 18 | 17 |
| 1 | 19 | 9 |
| 7 | 19 | 20 |
| 22 | 19 | 21 |
| 5 | 20 | 1 |
| 14 | 20 | 23 |
| 33 | 20 | 21 |
| 2 | 21 | 17 |
| 23 | 21 | 12 |
| 28 | 21 | 2 |

| Row | Column | Shift |
|---|---|---|
| 1 | 22 | 23 |
| 29 | 22 | 20 |
| 32 | 22 | 11 |
| 8 | 23 | 18 |
| 34 | 23 | 23 |
| 35 | 23 | 12 |
| 9 | 24 | 25 |
| 17 | 24 | 8 |
| 18 | 24 | 9 |
| 3 | 25 | 2 |
| 7 | 25 | 23 |
| 13 | 25 | 6 |
| 5 | 26 | 3 |
| 8 | 26 | 10 |
| 24 | 26 | 26 |
| 14 | 27 | 3 |
| 20 | 27 | 1 |
| 22 | 27 | 15 |
| 1 | 28 | 25 |
| 6 | 28 | 7 |
| 12 | 28 | 26 |
| 2 | 29 | 2 |
| 11 | 29 | 17 |
| 21 | 29 | 5 |
| 4 | 30 | 14 |
| 15 | 30 | 2 |
| 23 | 30 | 10 |

Figure 5C

Mother Code Matrix

| Row | Column | Shift |
|---|---|---|
| 10 | 31 | 16 |
| 16 | 31 | 11 |
| 19 | 31 | 9 |
| 6 | 32 | 13 |
| 16 | 32 | 19 |
| 26 | 32 | 6 |
| 4 | 33 | 17 |
| 12 | 33 | 20 |
| 19 | 33 | 6 |
| 1 | 34 | 7 |
| 3 | 34 | 23 |
| 7 | 34 | 22 |
| 24 | 34 | 6 |
| 5 | 35 | 25 |
| 10 | 35 | 22 |
| 11 | 35 | 15 |
| 14 | 35 | 17 |
| 20 | 35 | 11 |
| 21 | 35 | 13 |
| 25 | 35 | 22 |
| 27 | 35 | 17 |
| 36 | 35 | 10 |
| 2 | 36 | 10 |
| 8 | 36 | 4 |
| 9 | 36 | 6 |
| 13 | 36 | 9 |
| 15 | 36 | 12 |

| Row | Column | Shift |
|---|---|---|
| 17 | 36 | 6 |
| 18 | 36 | 15 |
| 22 | 36 | 12 |
| 23 | 36 | 8 |
| 1 | 37 | 25 |
| 2 | 37 | 25 |
| 12 | 37 | 19 |
| 2 | 38 | 7 |
| 3 | 38 | 26 |
| 28 | 38 | 24 |
| 3 | 39 | 21 |
| 4 | 39 | 8 |
| 17 | 39 | 18 |
| 4 | 40 | 13 |
| 5 | 40 | 14 |
| 25 | 40 | 21 |
| 5 | 41 | 9 |
| 6 | 41 | 11 |
| 10 | 41 | 14 |
| 6 | 42 | 13 |
| 7 | 42 | 1 |
| 11 | 42 | 6 |
| 7 | 43 | 4 |
| 8 | 43 | 17 |
| 15 | 43 | 1 |
| 8 | 44 | 5 |
| 9 | 44 | 13 |

| Row | Column | Shift |
|---|---|---|
| 34 | 44 | 8 |
| 9 | 45 | 26 |
| 10 | 45 | 22 |
| 30 | 45 | 21 |
| 10 | 46 | 3 |
| 11 | 46 | 17 |
| 33 | 46 | 6 |
| 11 | 47 | 15 |
| 12 | 47 | 22 |
| 32 | 47 | 25 |
| 12 | 48 | 26 |
| 13 | 48 | 12 |
| 26 | 48 | 25 |
| 13 | 49 | 5 |
| 14 | 49 | 24 |
| 28 | 49 | 25 |
| 14 | 50 | 2 |
| 15 | 50 | 2 |
| 30 | 50 | 19 |
| 15 | 51 | 8 |
| 16 | 51 | 14 |
| 20 | 51 | 1 |
| 16 | 52 | 25 |
| 17 | 52 | 7 |
| 32 | 52 | 1 |
| 17 | 53 | 5 |
| 18 | 53 | 14 |

Figure 5D

Mother Code Matrix

| Row | Column | Shift |
|---|---|---|
| 19 | 53 | 7 |
| 18 | 54 | 6 |
| 19 | 54 | 4 |
| 27 | 54 | 24 |
| 19 | 55 | 4 |
| 20 | 55 | 13 |
| 27 | 55 | 12 |
| 20 | 56 | 20 |
| 21 | 56 | 4 |
| 35 | 56 | 24 |
| 21 | 57 | 6 |
| 22 | 57 | 24 |
| 36 | 57 | 3 |
| 22 | 58 | 19 |
| 23 | 58 | 19 |
| 30 | 58 | 18 |
| 23 | 59 | 10 |
| 24 | 59 | 25 |
| 33 | 59 | 21 |
| 24 | 60 | 13 |
| 25 | 60 | 5 |
| 31 | 60 | 18 |
| 25 | 61 | 0 |
| 26 | 61 | 22 |
| 26 | 62 | 24 |
| 27 | 62 | 22 |
| 29 | 62 | 0 |

| Row | Column | Shift |
|---|---|---|
| 27 | 63 | 15 |
| 28 | 63 | 23 |
| 28 | 64 | 15 |
| 29 | 64 | 13 |
| 29 | 65 | 5 |
| 30 | 65 | 15 |
| 30 | 66 | 21 |
| 31 | 66 | 24 |
| 31 | 67 | 24 |
| 32 | 67 | 9 |
| 32 | 68 | 11 |
| 33 | 68 | 1 |
| 33 | 69 | 1 |
| 34 | 69 | 11 |
| 34 | 70 | 7 |
| 35 | 70 | 18 |
| 35 | 71 | 1 |
| 36 | 71 | 2 |
| 36 | 72 | staircase |

DATA CODING WITH AN EFFICIENT LDPC ENCODER

RELATED APPLICATIONS

This application claims the benefit of, under 35 USC 119, U.S. provisional application 60/688,820, filed on Jun. 8, 2005.

BACKGROUND OF THE INVENTION

1. Field of the Invention

The present invention generally relates to a method of coding data for transmission in a communication medium or channel.

2. Description of Related Art

In recent years, the wireless communications industry has grown in popularity with the development of new technologies that provide increased performance and speed. On a daily basis, people access, share, and exchange information with cellular telephones, personal computers, satellite communication devices, and various other personal and business computing systems. Modern communication devices are no longer bound by hardwired networks where wireless local area networks (WLAN) are implemented.

IEEE 802.11 defines various standards for wireless local area networks that currently include six over-the-air modulation techniques that utilize the same wireless communication protocol. The most widely accepted techniques are those defined by the IEEE 802.11a, b, and g standards. Other standards in IEEE 802.11 include c-f, h-j, and n, which are service enhancements, extensions, or corrections to previous standard specifications.

In modern wireless communications systems, data and information are encoded using compression and error correction algorithms to improve performance, integrity, and security of the transmitted data and information. There are many different coding processes for encoding messages. One such coding process includes a low density parity check (LDPC) code that utilizes a sparse parity check matrix. A sparse matrix is a matrix populated mostly with zeros. In LDPC code, the sparse matrix can be generated either randomly or by algebraic methods and subject to predefined constraints. These codes were first designed by Gallager in 1962.

Unfortunately, the coding technique of LDPC codes are highly complex and often require storing large sparse matrices, which can be difficult. Due to the demand of wireless services to support high data rates for multi-media applications, such as streaming video and high-speed web surfing, wireless communication service providers require a hardware infrastructure that can support these high data rates. Therefore, there currently exists a need for communication systems to employ LDPC codes efficiently to support high data rates without introducing greater complexity to the hardware infrastructure.

SUMMARY OF THE INVENTION

The present invention is generally directed to a method of coding data for transmission in a communication medium or channel. The method comprises generating a codeword from a mother code parity check matrix and a macro matrix. The mother code parity check matrix includes sub-matrices that are m-by-m square matrices with cyclic structure, and the macro matrix includes elements that represent nonzero sub-matrices of the mother code parity check matrix.

In one aspect, the codeword is an LDPC coded message having a plurality of data bits and a plurality of parity bits. For example, the LDPC coded message includes 972 data bits and 972 parity bits. The mother code parity check matrix is a lower triangular matrix in the macro matrix level and can change the code rate by row combining which maintains a constant codeword size of 1,944 bits.

In another aspect, the macro matrix comprises a j-by-k matrix and the mother code parity check matrix comprises a (j*m)-by-(k*m) matrix. The mother code parity matrix comprises a 972-by-1944 matrix, where m is 27, and the macro matrix comprises a 36-by-72 matrix for a rate ½ code. The rate ½ code is selectively varied to at least one of a rate ⅔ code, a rate ¾ code, and a rate ⅚ code by applying a row-combining technique to the mother code parity check matrix. For example, the rate ⅔ code results from combing the rows 1-12 with rows 19-30, the rate ¾ code results from combining rows 1-18 with rows 19-36, and the rate ⅚ code results from combining rows 1-12, rows 13-24, and rows 25-36 together.

In still another aspect, the mother code parity check matrix defines a constraint such that no bi-diagonal sub-matrices exist with each predefined pattern of row combining. The mother code parity check matrix allows column grouping, which refers to a column degree or the number of 1's in a column. The mother code parity check matrix avoids lengths of four cycles. The method is applied to the IEEE 802.11n MIMO standard.

Other features and advantages of the invention will be apparent from the following detailed description, taken in conjunction with the accompanying drawings which illustrate, by way of example, various features of embodiments of the invention.

BRIEF DESCRIPTION OF THE DRAWINGS

FIGS. 3A and 3B are examples of charts comprising various embodiments of degree distribution and column grouping.

FIGS. 4A and 4B are examples of interleavers for degree distribution.

FIGS. 5A thru 5D is an example of a mother code matrix.

DETAILED DESCRIPTION OF THE INVENTION

Reference will now be made to the drawings wherein like numerals refer to like parts throughout.

Figure 1:
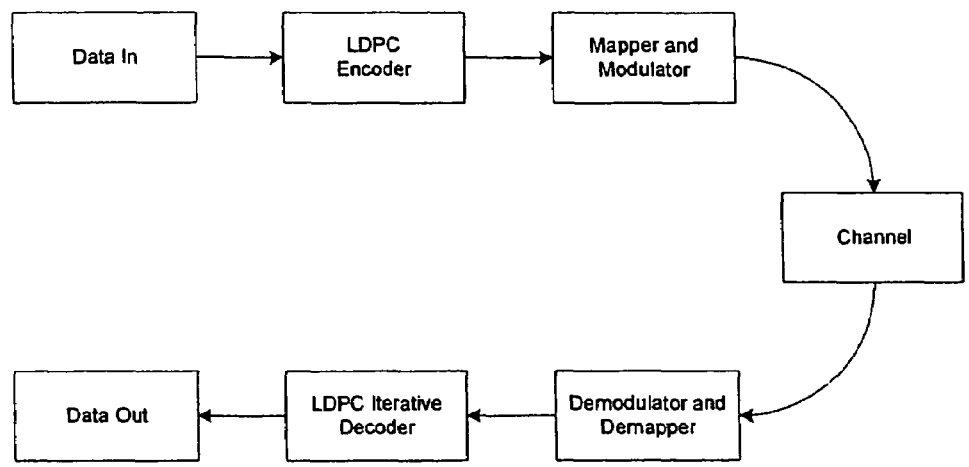
FIG. 1 is a block diagram of a communication system.

FIG. 1 is a block diagram of a communication system having an LDPC encoder and an LDPC iterative decoder. In one aspect, input data is encoded with the LDPC encoder and mapped and modulated with a mapper and modulator for transmission through the channel. The LDPC encoder generates message data having the input data and redundancy data prior to transmission through the channel so as to increase the reliability of the received message. The message encoded by the LDPC encoder includes a sequence of data bits and redundancy bits based on a predetermined LDPC error detection structure. The message is mapped and modulated with the mapper and modulator and then transmitted through the channel. The received message is demodulated and demapped with the demodulator and demapper. The demapped and demodulated message is decoded by the LDPC iterative decoder in accordance with the predetermined LDPC error detection structure. The decoded redundancy bits are utilized to detect errors in the data bits so that the transmitted data bits can be corrected.

IEEE 802.11 defines various standards for WLAN including modulation techniques and wireless communication protocols. The IEEE 802.11n standard for WLAN networks builds upon previous IEEE 802.11 standards by adding MIMO (multiple-input multiple-output). In general, additional transmitter and receiver antennas allow for increased data throughput through spatial multiplexing and increased range by exploiting spatial diversity.

IEEE 802.11 specifies parameters for physical (PHY) and medium access control (MAC) layers of the network. The PHY layer handles transmission of data between nodes and utilizes various transmission techniques including direct sequence spread spectrum (DSSS), frequency-hopping spread spectrum (FHSS), and infrared (IR) pulse position. IEEE 802.11 supports data rates of between 1 Mbps to 2 Mbps and operates in the 2.4 to 2.4835 GHz frequency band, which is an unlicensed band for industrial, scientific, and medical (ISM) applications, and 300 to 428,000 GHz for IR transmission.

The MAC layer establishes a set of protocols for maintaining transmission order within a shared medium or channel. IEEE 802.11 specifies a carrier sense multiple access with collision avoidance (CSMA/CA) protocol. For example, when a node receives a packet to be transmitted, the node listens to ensure that no other node is currently transmitting. If the medium or channel is clear, the node then transmits the packet. Otherwise, the node waits a predetermined period of time prior to packet transmission.

For example, during packet transmission between at least two nodes, a first node transmits a ready-to-send (RTS) packet on the channel, which includes information on packet length. When a second node receives the RTS packet, the second node responds to the first node by transmitting a clear-to-send (CTS) packet to the first node on the channel. After packet exchange, the first node transmits the data packet to the second node. When the transmitted data packet is successfully received by the second node, as determined by a cyclic redundancy check (CRC), the second node transmits an acknowledgment (ACK) packet to the first node. If a third node was operating in the same medium or channel, the protocol alerts the third node that the first and second nodes are busy. The third node waits for a clear channel before transmitting a data packet to either the first or second node.

WLAN communication standards, such as IEEE 802.11n, need an advanced code to provide additional gain to achieve some of the modes in MIMO, such as spatial multiplexing, for given channels. The present teachings outline a structure for LDPC codes that are applicable to 802.11n and hardware efficient so as to maintain a high level of performance similar to that of an unstructured random code. The basic governing structure for the LDPC codes includes a mother code parity check matrix, H, having small building blocks, such as sub-matrices, that are m-by-m square matrices with cyclic structures. A macro matrix, $H^M$, is a j-by-k matrix whose elements represent the nonzero sub-matrices in H. Therefore, in one embodiment, the mother code parity check matrix, H, comprises a (j*m)-by-(k*m) matrix. This structure allows for a reduced storage memory for H, wherein only the macro matrix and its shift values require storage. In addition, a simplified addressing via shift-registers can be utilized.

Figure 2A:
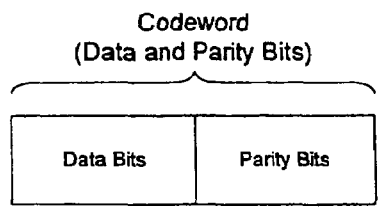
FIGS. 2A and 2B are block diagrams of various embodiments of a codeword generated by an LDPC encoder.

FIG. 2A is a block diagram of one embodiment of a codeword generated by the LDPC encoder. In one aspect, the LDPC encoder receives a plurality of data bits and generates a plurality of parity bits to form a codeword comprising the received data bits and the generated parity bits for a predefined code rate. The LDPC encoder utilizes the corresponding parity check matrix which is row-combined from the mother code matrix H to generate the codeword. The mother code matrix H and corresponding parity check matrix comprise a plurality of rows and a plurality of columns.

FIGS. 5A thru 5D illustrate one embodiment of a mother code parity check matrix of the present invention with cyclic shift.

Figure 2B:
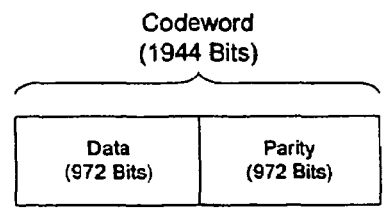

FIG. 2B is a block diagram of another embodiment of a codeword generated by the LDPC encoder. In one aspect, the LDPC encoder is adapted to receive 972 data bits and generate 972 parity bits to form a codeword comprising 1944 bits for a rate ½ code. In this example, the mother code matrix, H, comprises a (36*27)-by-(72*27) matrix, the sub-matrix, $H_m$, comprises a 27-by-27 matrix, and the macro matrix, $H^M$, comprises a 36-by-72 matrix. In general, the rate ½ code can be defined as having 2 bits for every data bit. It should be appreciated that various other code rates can be utilized without departing from the scope of the present teachings, which will be described in greater detail below.

In one embodiment, the macro matrix, $H_M$, of the mother code matrix comprises a lower triangular matrix, which leads to a low complexity encoder. The macro matrix also allows predefined row combining so that no doubly-diagonal sub-matrix is formed except the lower-right staircase sub-matrix.

Row combining of the mother code matrix can be achieved and implemented in hardware. The mother code matrix provides flexible code rates, and, with row combining of the mother code matrix, code rates of ⅔, ¾, and ⅚ can be achieved. In general, a code rate of ½ provides more protection of the data with less data efficiency, and a code rate of ⅚ provides less protection of the data with better data transmission efficiency. Row combining provides a trade-off between data efficiency and coding gain without having to implement different encoders and decoders.

In one aspect, after row combining, a constraint is defined such that no bi-diagonal sub-matrices exist, which allows for parallelization during processing. It should be appreciated that this constraint may be provided with or without row combining.

In another aspect, the mother code matrix allows column grouping, which refers to a column degree or the number of 1's in a column.

In still another aspect, the mother code matrix avoids lengths of four cycles, wherein a desirable length is at least 6 or more cycles.

This structure can be applied to the IEEE 802.11n MIMO standard. In one embodiment, the mother code parity matrix, H, comprises a 972-by-1944 matrix, where m is 27, and the macro-matrix, $H^M$, comprises a 36-by-72 matrix for the rate ½ code. The structure can be rate-compatible. The rate ½ code is the mother code, and the code rate can be selectively varied to at least one of a rate ⅔ code, a rate ¾ code, and a rate ⅚ code by applying a row-combining technique to the mother code parity check matrix. In one aspect, the rate ⅔ code can result from combing the rows 1-12 with rows 19-30, the rate ¾ code can result from combining rows 1-18 with rows 19-36, and the rate ⅚ code can result from combining rows 1-12, rows 13-24, and rows 25-36 together.

The structure can involve low-complexity encoding. By proper column reordering and adding at least one staircase matrix, an IPP (Irregular Partitioned Permutation) code with a lower triangular structure can be formed. With this structure, the encoder could easily be implemented by using back-substitution for a low complexity implementation. In one embodiment, an object of the present invention is to form an LD-IPP (Lower Triangular Irregular Partitioned Permutation) code.

The structure can avoid bi-diagonal sub-matrices. In the IPP code decoder, bi-diagonal sub-matrices, which result from the addition of one or more cyclic-shifted identity sub-matrix, can cause problems on the routing and decoder parallelization. Thus, in one embodiment, bi-diagonal sub-matrices are avoided at the rate ½ mother code and also in the higher code rates that take into consideration the effects from row combining.

The structure can provide column grouping. In the rate ½ macro matrix, $H^M$, columns form groups such that, within each group, every row has at most only one nonzero element. The constraint can be made even tighter for further efficiency by ensuring every row has exactly one nonzero element. By doing so, all column blocks in any section can be grouped into a single bit update unit comprising just three memories. This allows for a reduction in the number of memories and simplifies the address generation logic as well as routing.

The structure can also avoid length—4 cycles and small stopping sets, which can ensure good performance at high SNR of the LDPC codes.

The structure provides degree distribution and column grouping. In one aspect, the 36-by-72 $H^M$ can be formed with changes in the degree distribution such that complete column groups can be formed. For example, the sum of the degree of all columns in a group is 36, and, within a group, each row has exactly one nonzero element. In one embodiment, the macro-matrix formed with degree distribution includes: $N_v(8)=2$, $N_v(7)=10$, $N_v(3)=48$, and $N_v(2)=12$. In addition, the column grouping is shown in FIG. 3A.

In another embodiment, a degree distribution with a column degree of 9 can be obtained so as to avoid bi-diagonal sub-matrices. With row combining, a nonzero element in a column provides the constraint on the other three positions. Therefore, there can be 36/4=9 non-zeros in a column without introducing bi-diagonal sub-matrices as shown in FIG. 3B.

The structure may comprise a Lower-Triangular Structure. In one aspect, the macro-matrix is generated with the constraints that bi-diagonal sub-matrices do not exist before or after row combining. Note that this matrix is designed for the decoder. By reordering the columns, the macro matrix becomes lower triangular, and the reordered matrix can be used in the encoder. A column interleaver can be utilized in front of the decoder to arrange the columns into groups such that the decoder has lower complexity routing and hardware implementation. After the decoder, the decoded outputs can pass a column de-interleaver and the first K bits are the desired decoded information bits.

In one aspect, to make graph conditioning and code design easier, the corresponding lower triangular columns are evenly distributed into different groups to ease the design constraints. In the degree distribution (A) of FIG. 3A, encoder columns **36+(3\*n+1), 36+(3\*n+2), and 36+(3\*n+3), n=0, 1, . . . , 7 are placed in the three degree-3 groups, columns 60+(2\*n+1), n=0, 1, . . . , 5 are placed in group 6 (degree-2); and columns 60+(2\*n+2), n=0, 1, . . . , 4 are placed in group 7**. The column interleaver that operates at the block level for degree distribution (A) is shown in FIG. 4A. The column interleaver that operates at the block level for degree distribution (B) is shown in FIG. 4B.

Once the macro-matrix is generated, shift values of each nonzero sub-matrix are generated randomly with the constraints that small stopping sets are avoided at each of the four rates. In one aspect, length-four cycles are avoided in the macro-matrix formation.

The permutation block structured LDPC codes perform similar to the unstructured LDPC codes with the same degree distributions. Note that small stopping sets are avoided to reduce high error floors during the code design for both cases. As a result, the structured design that simplifies the hardware implementation comes without performance loss due to the relatively large degree of freedom of the parity-check matrix.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method of coding data for transmission in a communication channel comprising:
   generating a codeword from a mother code parity check matrix and a macro matrix, wherein the mother code parity check matrix comprises a (j\*m)-by-(k\*m) matrix and includes sub-matrices that are m-by-m square matrices with cyclic structure, and wherein the macro matrix comprises a j-by-k matrix and includes elements that represent nonzero sub-matrices of the mother code parity check matrix.

2. The method of claim 1, wherein the codeword is an LDPC coded message having a plurality of data bits and a plurality of parity bits.

3. The method of claim 2, wherein the LDPC coded message includes 972 data bits and 972 parity bits.

4. The method of claim 1, wherein the mother code parity check matrix comprises a lower triangular macro matrix, and wherein the mother code parity check matrix allows predefined row combining so that no doubly-diagonal sub-matrix is formed except the lower-right staircase sub-matrix.

5. The method of claim 1, wherein the mother code parity matrix comprises a 972-by-1944 matrix, where m is 27, and the macro matrix comprises a 36-by-72 matrix for a rate ½ code.

6. The method of claim 5, wherein the rate ½ code is selectively varied to at least one of a rate ⅔ code, a rate ¾ code, and a rate ⅚ code by applying a row-combining technique to the mother code parity check matrix, wherein a rate ⅔ code results from combing the rows 1-12 with rows 19-30, the rate ¾ code results from combining rows 1-18 with rows 19-36, and the rate ⅚ code results from combining rows 1-12, rows 13-24, and rows 25-36 together.

7. The method of claim 1, wherein the mother code parity check matrix defines a constraint such that no bi-diagonal sub-matrices exist.

8. The method of claim 1, wherein the mother code parity check matrix allows column grouping, which refers to a column degree or the number of 1's in a column.

9. The method of claim 1, wherein the mother code parity check matrix avoids lengths of four cycles.

10. The method of claim 1, wherein the method is applied to the IEEE 802.11n MIMO standard.

11. An LDPC encoder for encoding data for transmission through a communications channel, comprising:
    means for generating a codeword from a mother code parity check matrix and a macro matrix, wherein the mother code parity check matrix comprises a (j\*m)-by-(k\*m)

matrix and includes sub-matrices that are m-by-m square matrices with cyclic structure, and wherein the macro matrix comprises a j-by-k matrix and includes elements that represent nonzero sub-matrices of the mother code parity check matrix.

12. The LDPC encoder of claim 11, wherein the codeword is an LDPC coded message having a plurality of data bits and a plurality of parity bits.

13. The LDPC encoder of claim 12, wherein the LDPC coded message includes 972 data bits and 972 parity bits.

14. The LDPC encoder of claim 11, wherein the mother code parity check matrix comprises a lower triangular matrix with at least one 1 in each row, and wherein the mother code parity check matrix allows row combining so that no two 1's are combined.

15. The LDPC encoder of claim 11, wherein the mother code parity matrix comprises a 972-by-1944 matrix, where m is 27, and the macro matrix comprises a 36-by-72 matrix for a rate ½ code.

16. The LDPC encoder of claim 11, wherein the rate ½ code is selectively varied to at least one of a rate ⅔ code, a rate ¾ code, and a rate ⅚ code by applying a row-combining technique to the mother code parity check matrix, wherein a rate ⅓ code results from combing the rows 1-12 with rows 19-30, the rate ¾ code results from combining rows 1-18 with rows 19-36, and the rate ⅚ code results from combining rows 1-12, rows 13-24, and rows 25-36 together.

17. A communications system comprising:
   an LDPC encoder for encoding data for transmission through a communications channel, wherein the encoder generates a codeword from a mother code parity check matrix and a macro matrix, wherein the mother code parity check matrix comprises a (j*m)-by-(k*m) matrix and includes sub-matrices that are m-by-m square matrices with cyclic structure, and wherein the macro matrix comprises a j-by-k matrix and includes elements that represent nonzero sub-matrices of the mother code parity check matrix; and
   an LDPC iterative decoder for decoding the encoded data received through the communications channel in accordance with a predetermined LDPC error detection structure.

18. The communications system of claim 17, and further comprising:
   a mapper and a modulator for mapping and modulating the encoded data before transmission through the communications channel; and
   a demapper and demodulator for demapping and demodulating the encoded data received through the communications channel.

* * * * *

UNITED STATES PATENT AND TRADEMARK OFFICE
CERTIFICATE OF CORRECTION

PATENT NO. : 7,627,805 B2  Page 1 of 1
APPLICATION NO. : 11/448603
DATED : December 1, 2009
INVENTOR(S) : Mittelsteadt et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 826 days.

Signed and Sealed this

Second Day of November, 2010

David J. Kappos
*Director of the United States Patent and Trademark Office*